United States Patent
Chen et al.

(10) Patent No.: US 11,676,656 B2
(45) Date of Patent: Jun. 13, 2023

(54) MEMORY ARCHITECTURE WITH DC BIASING

(71) Applicant: Arm Limited, Cambridge (GB)

(72) Inventors: Andy Wangkun Chen, Austin, TX (US); Yew Keong Chong, Austin, TX (US); Rajiv Kumar Sisodia, Bangalore (IN); Sriram Thyagarajan, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/168,428

(22) Filed: Feb. 5, 2021

(65) Prior Publication Data

US 2022/0254411 A1    Aug. 11, 2022

(51) Int. Cl.
    *G11C 11/419*    (2006.01)
    *G11C 11/412*    (2006.01)

(52) U.S. Cl.
    CPC .......... *G11C 11/419* (2013.01); *G11C 11/412* (2013.01)

(58) Field of Classification Search
    CPC .............................. G11C 11/419; G11C 11/412
    See application file for complete search history.

(56) References Cited

U.S. PATENT DOCUMENTS

| | | | | |
|---|---|---|---|---|
| 5,574,687 A * | 11/1996 | Nakase | ..................... | G11C 7/12 365/189.11 |
| 5,781,469 A * | 7/1998 | Pathak | .................. | G11C 11/419 365/72 |
| 5,828,612 A * | 10/1998 | Yu | ......................... | G11C 11/419 365/207 |
| 5,850,364 A * | 12/1998 | Ueno | .................... | G11C 11/419 365/230.03 |
| 6,130,846 A * | 10/2000 | Hori | ......................... | G11C 7/22 365/204 |
| 2006/0274587 A1* | 12/2006 | Houston | ................... | G11C 7/12 365/203 |
| 2007/0165447 A1* | 7/2007 | Wagner | ................. | G11C 11/412 365/154 |
| 2010/0008171 A1* | 1/2010 | Park | ......................... | G11C 7/12 365/230.06 |
| 2013/0258789 A1* | 10/2013 | Takahashi | ............. | G11C 11/413 365/189.09 |
| 2020/0125693 A1* | 4/2020 | Frederick, Jr. | ........ | G11C 11/412 |

\* cited by examiner

*Primary Examiner* — Khamdan N. Alrobaie
(74) *Attorney, Agent, or Firm* — Pramudji Law Group PLLC; Ari Pramudji

(57) ABSTRACT

Various implementations described herein are related to a device having memory circuitry with bitlines coupled to an array of bitcells. Also, the device may have first precharge circuitry that precharges the bitlines before a write cycle. Also, the device may have second precharge circuitry that precharges the bitlines after the write cycle.

19 Claims, 6 Drawing Sheets

MEMORY ARCHITECTURE WITH DC BIASING

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional memory applications, 6-transistor (6T) static random access memory (SRAM) cells have been prone to read-disturb issues, such as, e.g., a bitcell flipping while being read during a read operation. Also, in some instances, 8T SRAM bitcells isolate read and write access operations; however, in some high-level multiplexer (mux) applications and designs with write-mask features, even 8T SRAM bitcells have read-disturb issues that can affect inadvertent bitcell flipping. These deficiencies can degrade memory performance, and as such, there exists a need to overcome these deficiencies by improving bitcell layout design of SRAM bitcells in some memory applications so as to improve memory performance without negatively impacting read operations and/or write operations.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to bitcell biasing schemes and techniques for multi-port memory applications in physical design. For instance, various schemes and techniques described herein may provide for a multi-transistor (e.g., 8T) static random access memory (SRAM) bitcell that uses a low-power read-disturb-stable 8T-SRAM bitcell architecture for faster write cycle so as to improve performance and write margin. Also, various schemes and techniques described herein may selectively control the use of noise injection in relation to wordline voltage and bitline voltage. For instance, since a bitcell latch is isolated from a read-stack of transistors, and since write bitline levels may not impact read current, the write bitlines may be precharged to a lower voltage level without degrading write operations, which may improve the noise margin. As such, various schemes and techniques described herein may provide for a bitcell layout design that precharges the write bitlines to a lower level (e.g., 15-25% lower than the supply voltage). This technique may be achieved by keeping bitlines precharged to an intermediate voltage level (e.g., VDD–Vt) initially before start of a write cycle. Also, this technique may be achieved by then precharging the bitlines to a desired voltage level of, e.g., 15%-25% (e.g., approximately 100-200 mV) lower than the supply voltage level (VDD) using a DC bias voltage in at the start of a write cycle.

Various implementations of providing memory architecture with DC biasing will be described in greater detail herein with reference to FIGS. 1-2.

Figure 1:
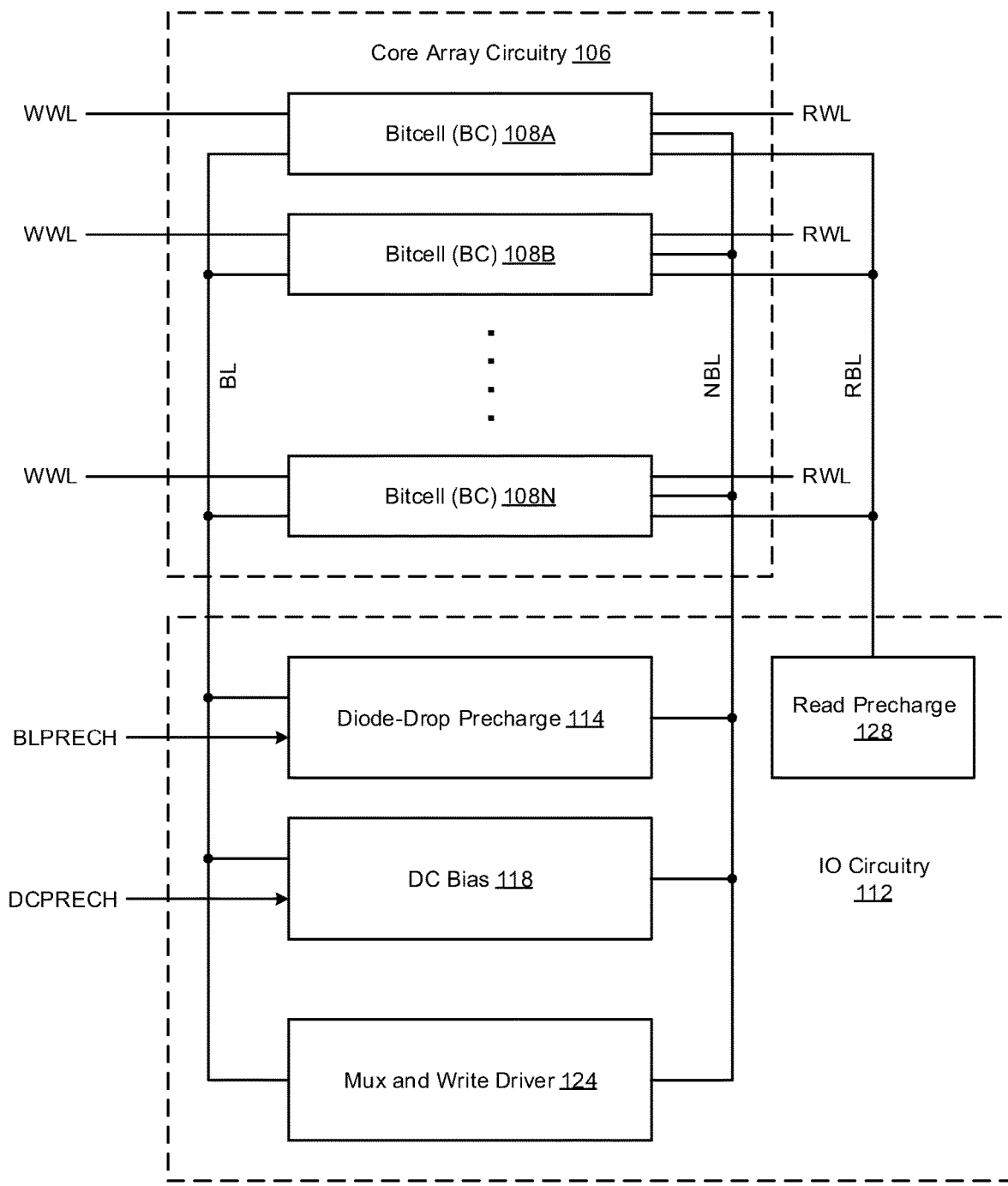
FIG. 1 illustrates a schematic diagram of memory architecture having DC biasing circuitry in accordance with various implementations described herein.

FIG. 1 illustrates a schematic diagram 100 of memory architecture 104 with DC biasing circuitry 118 in accordance with various implementations described herein.

In various implementations, the memory architecture 104 may be implemented as a system or a device having various integrated circuit (IC) components that are arranged and coupled together as an assemblage or combination of parts that provide for physical circuit designs and various related structures. In some instances, a method of designing, providing building and/or fabricating the memory architecture 104 as an integrated system or integrated device may involve use of various IC circuit components described herein so as to implement memory fabrication schemes and techniques associated therewith. Moreover, the memory architecture 104 may be integrated with various computing circuitry and related components on a single chip, and the memory architecture 104 may be implemented and incorporated in various embedded systems for automotive, electronic, mobile, server and Internet-of-things (IoT) applications, including remote sensor nodes.

As shown in FIG. 1, the memory architecture 104 may have multiple bitcells (BC: 108A, 108B, . . . , 108N) arranged in core array circuitry 106. In various implementations, the bitcells (BC: 108A, 108B, . . . , 108N) may refer to eight-transistor (8T) multi-port memory cells with a dedicated write port and a dedicated read port. As such, the memory architecture 104 may include write wordlines (WWL), write bitlines (BL, NBL), read wordlines (RWL), and read bitlines (RBL). The write wordlines (WWL) may be coupled directly to corresponding bitcells (BC: 108A, 108B, . . . , 108N), and also, the read wordlines (RWL) may be coupled directly to corresponding bitcells (BC: 108A, 108B, . . . , 108N). Moreover, the write bitlines (BL, NBL) may be routed from the bitcells (BC: 108A, 108B, . . . , 108N) to diode-drop precharge circuitry 114, DC biasing circuitry 118, and multiplexer (mux) and write driver circuitry 124. Also, the read bitlines (RBL) may be routed to read precharge circuitry 128.

As such, in some implementations, the memory architecture 104 may include the core array circuitry 106 and input-output (IO) circuitry 112. As shown in FIG. 1, the core array circuitry 106 may include the bitcells (BC: 108A, 108B, . . . , 108N), and the IO circuitry 112 may include the diode-drop precharge circuitry 114, the DC biasing circuitry 118, the mux and write driver circuitry 124, and the read precharge circuitry 128. Also, the diode-drop precharge circuitry 114 may be coupled between the bitlines (BL, NBL) and receive a bitline precharge enable signal (BL- PRECH), and the DC bias circuitry 118 may be coupled between the bitlines (BL, NBL) and receive a DC precharge enable signal (DCPRECH). Also, the mux and write driver circuitry 124 may be coupled between the bitlines (BL, NBL), and the read precharge circuitry 128 may be coupled to the bitcells (BC: 108A, 108B, . . . , 108N).

Moreover, in some implementations, the memory architecture 104 may include the memory circuitry (e.g., core array circuitry 106) having bitlines (BL, NBL, RBL) coupled to the array of bitcells (BC: 108A, 108B, . . . , 108N). The memory architecture 104 may include first precharge circuitry (e.g., DC bias circuitry 118) that is configured to precharge one or more bitlines (e.g., BL, NBL) before a write cycle. Also, the memory architecture 104 may include second precharge circuitry (e.g., diode-drop precharge circuitry 114) that may be configured to precharge the one or more bitlines (e.g., BL, NBL) after the write cycle. The first precharge circuitry may refer to the direct-current (DC) bias circuitry 118 that precharges and keeps the bitlines (BL, NBL) above an initial voltage level (IV) that is lower than a supply voltage level (VDD) before the write cycle. In some instances, the initial voltage level (IV) may refer to the difference between the voltage supply level (VDD) and a threshold voltage level (Vt), such that IV=VDD−Vt. Also, during a start of the write cycle for a write operation, the DC bias circuitry 118 may apply the initial voltage level (IV) as a DC bias pulse to the bitlines (BL, NBL) for a short duration. Further, the DC bias pulse may provide a tunable bitline precharge voltage level for improving noise margin associated with the bitlines.

In some implementations, the memory circuitry (e.g., core array circuitry 106) may include wordlines (e.g., WWL, RWL) coupled to the array of bitcells (BC: 108A, 108B, . . . , 108N). Also, in various instances, a rising edge of a wordline signal on at least one wordline (WWL) of the wordlines may be delayed and start after the DC bias pulse ends.

Also, in some implementations, the second precharge circuitry may refer to the diode-drop precharge circuitry 114 that is configured to precharge and keep the bitlines (BL, NBL) at a diode-drop voltage level (DDV) that is lower than a supply voltage level (VDD) after the write cycle. In some instances, the diode-drop voltage level (DDV) may be within a range of 15-20% lower than the voltage supply level (VDD).

Further, in some implementations, in reference to a diode-drop only configuration, the DC bias circuitry 118 may include multiple DC bias circuits, such as, e.g., a first DC bias circuit and a second DC bias circuit, that are coupled together and configured to selectively precharge the bitlines (BL, NBL) in one or more operational modes based on an operating voltage. For instance, the memory architecture 104 may have third precharge circuitry (e.g., another DC bias circuit) that may be configured to precharge the bitlines (BL, NBL) in a first operation mode based on an operating voltage. In this instance, the first precharge circuitry (e.g., first DC bias circuitry) may be configured to precharge the bitlines (BL, NBL) in a second operational mode based on the operating voltage that is different than the first operational mode. Also, in this instance, the second precharge circuitry (diode-drop precharge circuitry 114) may be configured to precharge the bitlines (BL, NBL) in a third operational mode based on the operating voltage that is different than the first operational mode and/or the second operational mode. The first operational mode may refer to low voltage operation, wherein the bitlines (BL, NBL) are kept at a voltage level above the diode-drop voltage level (DDV) using the third precharge circuitry (e.g., second DC bias circuitry). The second operational mode may refer to nominal voltage operation, wherein the bitlines (BL, NBL) are kept at a voltage level above the diode-drop voltage level (DDV) using first precharge circuitry. Also, the third operational mode may refer to high voltage operation using the second precharge circuitry (e.g., second DC bias circuitry).

In some implementations, the memory architecture 104 may refer to static random access memory (SRAM) architecture with multiple access ports controlled by wordlines (WL, RWL) and bitlines (BL, NBL, RBL). Also, the bitcells (BC: 108A, 108B, . . . , 108N) may refer to SRAM bitcells that are implemented with 8T multi-port bitcells. Also, in some instances, the bitcells (BC: 108A, 108B, . . . , 108N) may include multiple transistors (e.g., 8T) that refer to field effect transistor (FET) devices, such as, e.g., P-type FET (PFET) devices and/or N-type FET (NFET) devices. Moreover, the multiple access port devices may be varied within the 8T multiple-port bitcell so that some access devices (e.g., by port) are NFET devices and some access devices by port are PFET devices.

Figure 2:
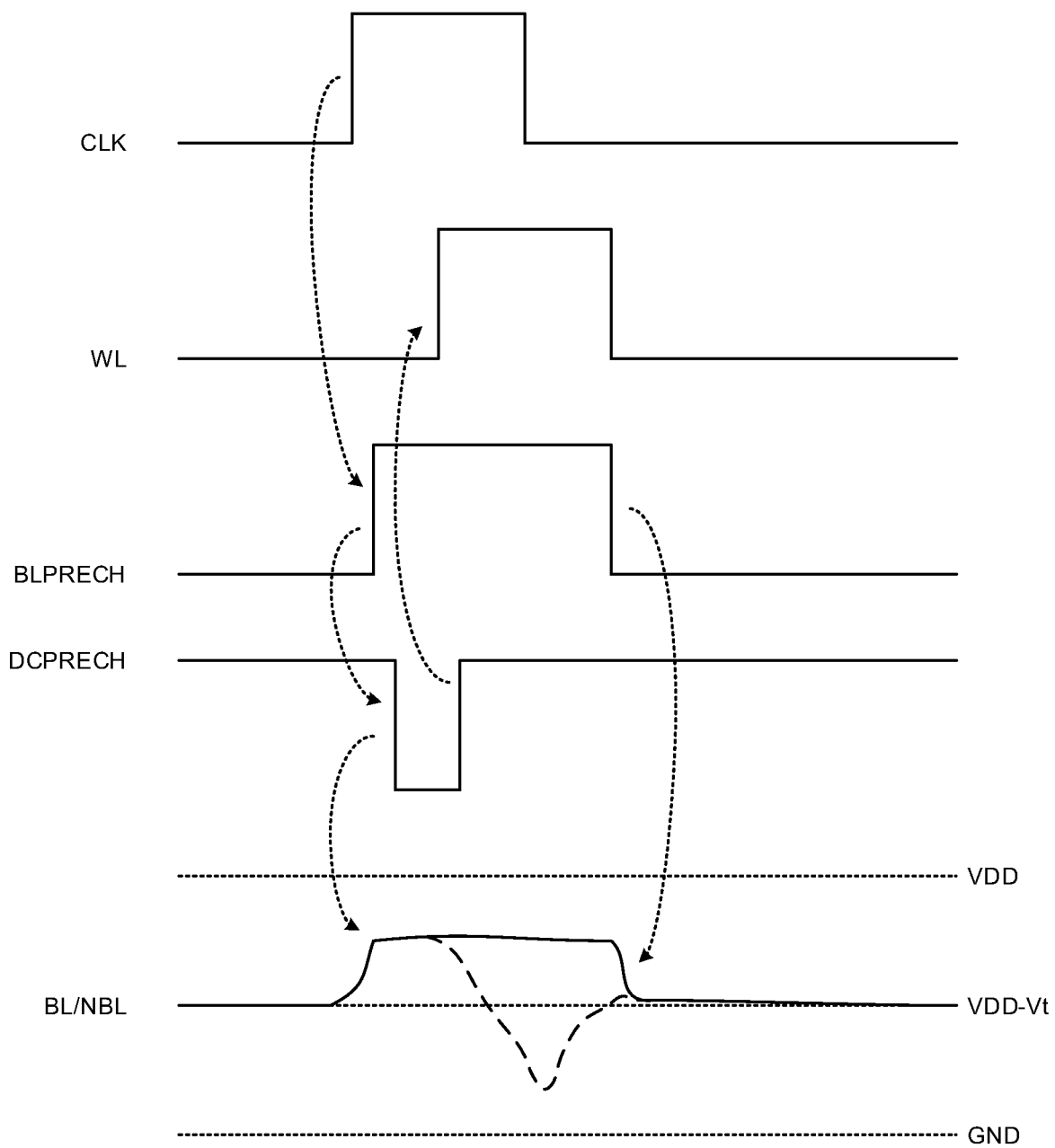
FIG. 2 illustrates a waveform diagram of operating memory architecture with DC biasing circuitry in accordance with implementations described herein.

FIG. 2 illustrates a waveform diagram 200 of operating memory architecture with a DC biasing technique 204 in accordance with implementations described herein.

In some implementations, as shown in FIG. 2, the waveform diagram 200 shows that a rising edge of a clock pulse (CLK) may be used to trigger a rising edge of a bitline precharge pulse (BLPRECH), which may then trigger a falling edge of a DC precharge pulse (DCPRECH). Also, as shown, the rising ending edge of the short negative DC precharge pulse (DCPRECH) then triggers the rising edge of a wordline pulse (WL). Further, as shown, the rising edge of the clock pulse (CLK) may be used to precharge the bitlines (BL, NBL) toward VDD, and then the falling edge of the DC precharge pulse (DCPRECH) may be used to keep the bitlines (BL, NBL) precharged to a voltage level above VDD−Vt, e.g., instead of falling toward ground (GND), as shown in FIG. 2 with the dashed line. Also, as shown, the falling edge of the bitline precharge pulse (BLPRECH) may be used to trigger the falling edge of the precharged bitline voltage to the voltage level associated with VDD−Vt.

Moreover, in various implementations, in reference to FIGS. 1-2, operation of the memory architecture 104 may provide for write bitlines (WWL) that are default precharged to the diode-drop voltage level at the end of the write cycle. During the start of a write operation, a small DC bias voltage may be selectively enabled for a short duration, e.g., as shown in reference to FIG. 2. This DC bias voltage may provide for a tunable bitline precharge level as needed for improved noise margin. Also, during operation, the rising of the write wordline (WWL) may be delayed and may start after the DC bias pulse. These techniques provide for a different bitline precharge level based on an operating voltage, and since the static noise margin improves at higher voltage, the bitlines may be kept at the diode-drop voltage so as to not negatively impact write operations, which may also allow for power-saving.

Also, in reference to the nominal voltage domain, the bitlines may be kept at a level above the diode-drop using a first DC bias circuit, which provides for sufficient power saving along with improved noise margin. Further, in reference to a low voltage domain, the bitlines may be kept at a level above the diode-drop using a second DC bias circuit, which may also provide for improved noise margin without negatively impacting write operations.

Various implementations of providing memory architecture with equalizing circuitry will be described herein with reference to FIGS. 3-4.

Figure 3:
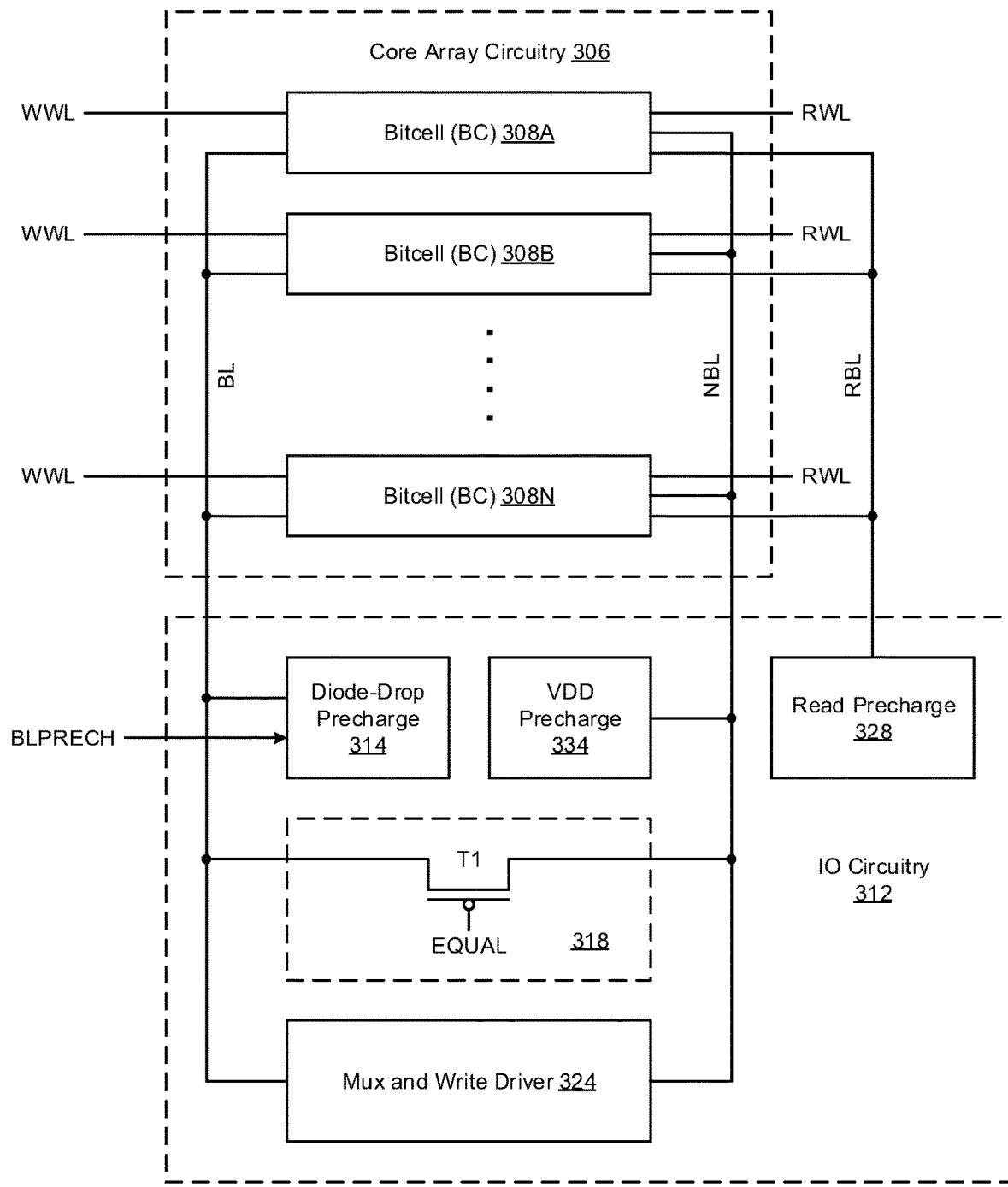
FIG. 3 illustrates a schematic diagram of memory architecture having equalizing circuitry in accordance with various implementations described herein.

FIG. 3 illustrates a schematic diagram 300 of memory architecture 304 having equalizing circuitry 318 in accordance with various implementations described herein.

In various implementations, the memory architecture 304 may be implemented as a system or a device having various integrated circuit (IC) components that are arranged and coupled together as an assemblage or combination of parts that provide for physical circuit designs and various related structures. In some instances, a method of designing, providing building and/or fabricating the memory architecture 304 as an integrated system or integrated device may involve use of various IC circuit components described herein so as to implement memory fabrication schemes and techniques associated therewith. Moreover, the memory architecture 304 may be integrated with various computing circuitry and related components on a single chip, and the memory architecture 304 may be implemented and incorporated in various embedded systems for automotive, electronic, mobile, server and Internet-of-things (IoT) applications, including remote sensor nodes.

As shown in FIG. 3, the memory architecture 304 may have multiple bitcells (BC: 308A, 308B, . . . , 308N) arranged in core array circuitry 306. In various implementations, the bitcells (BC: 308A, 308B, . . . , 308N) may refer to eight-transistor (8T) multi-port memory cells with a dedicated write port and a dedicated read port. As such, the memory architecture 304 may include write wordlines (WWL), write bitlines (BL, NBL), read wordlines (RWL), and read bitlines (RBL). The write wordlines (WWL) may be coupled directly to corresponding bitcells (BC: 308A, 308B, . . . , 308N), and also, the read wordlines (RWL) may be coupled directly to corresponding bitcells (BC: 308A, 308B, . . . , 308N). Moreover, the write bitlines (BL, NBL) may be routed from the bitcells (BC: 308A, 308B, . . . , 308N) to diode-drop precharge circuitry 314, equalizing circuitry 318, VDD precharge circuitry 334, and mux and write driver circuitry 324. Also, the read bitlines (RBL) may be routed to read precharge circuitry 328.

As such, in some implementations, the memory architecture 304 may include the core array circuitry 306 and input-output (IO) circuitry 312. As shown in FIG. 3, the core array circuitry 306 may include the bitcells (BC: 308A, 308B, . . . , 308N), and the IO circuitry 312 may include the diode-drop precharge circuitry 314, the equalizing circuitry 318, the VDD precharge circuitry 334, the mux and write driver circuitry 324, and also the read precharge circuitry 328. In some instances, the diode-drop precharge circuitry 314 may be coupled to a first bitline (BL) and receive a bitline precharge enable signal (BLPRECH), and the VDD precharge circuitry 334 may be coupled to a second bitline (NBL). Also, in some instances, the equalizing circuitry 318 along with the mux and write driver circuitry 324 may be coupled between the bitlines (BL, NBL), and the read precharge circuitry 328 may be coupled to the bitcells (BC: 308A, 308B, . . . , 308N).

Moreover, in some implementations, the memory architecture 304 may include the memory circuitry (e.g., core array circuitry 306) having bitlines (BL, NBL, RBL) coupled to the array of bitcells (BC: 308A, 308B, . . . , 308N). The memory architecture 304 may include first precharge circuitry (e.g., diode-drop precharge circuitry 314) that is configured to precharge one or more bitlines (e.g., the first bitline (BL)) to a diode-drop voltage level (DDV) before a write cycle. Also, the memory architecture 304 may include second precharge circuitry (e.g., VDD precharge circuitry 334) that is configured to precharge one or more bitlines (e.g., the second bitline (NBL)) to the supply voltage level (VDD) before the write cycle. The memory architecture 304 may further include the equalizing circuitry 318 (i.e., equal biasing circuitry) having a passgate transistor (T1) that is coupled between the first bitline (BL) and the second bitline (NBL). In some instances, during a start of a write cycle, the passgate transistor (T1) may be selectively enabled with an equalize activation signal (EQUAL) so as to equalize the first bitline (BL) and the second bitline (NBL) to an intermediate voltage level, which may be between, e.g., VDD and VDD–Vt.

In some implementations, the first precharge circuitry may refer to the diode-drop precharge circuitry 314 that is configured to precharge the first bitline (BL) to the diode-drop voltage level (DDV) before the write cycle. Also, in various instances, the diode-drop voltage level (DDV) may be lower than the supply voltage level (VDD), such that VDD>DDV. Also, in some instances, the diode-drop voltage level (DDV) may be greater than the difference in voltage between the voltage supply level (VDD) and a threshold voltage level (Vt), such that VDD>DDV>VDD–Vt. Also, the second bitline (NBL) is complementary to the first bitline (BL), and the second bitline (NBL) may support a greater load than the first bitline (BL).

In some implementations, the memory architecture 304 may refer to static random access memory (SRAM) architecture with multiple access ports controlled by wordlines (WL, RWL) and bitlines (BL, NBL, RBL). Also, the bitcells (BC: 308A, 308B, . . . , 308N) may refer to SRAM bitcells that are implemented with 8T multi-port bitcells. Also, in some instances, the bitcells (BC: 308A, 308B, . . . , 308N) may include multiple transistors (e.g., 8T) that refer to field effect transistor (PFET) devices, such as, e.g., P-type FET (PFET) devices and/or N-type FET (NFET) devices. The passgate transistor (T1) may refer to a PFET device coupled between the bitlines (BL, NBL). Further, in some instances, the multiple access port devices may be varied within the 8T multiple-port bitcell so that some access devices (e.g., by port) are NFET devices and some access devices by port are PFET devices.

Figure 4:
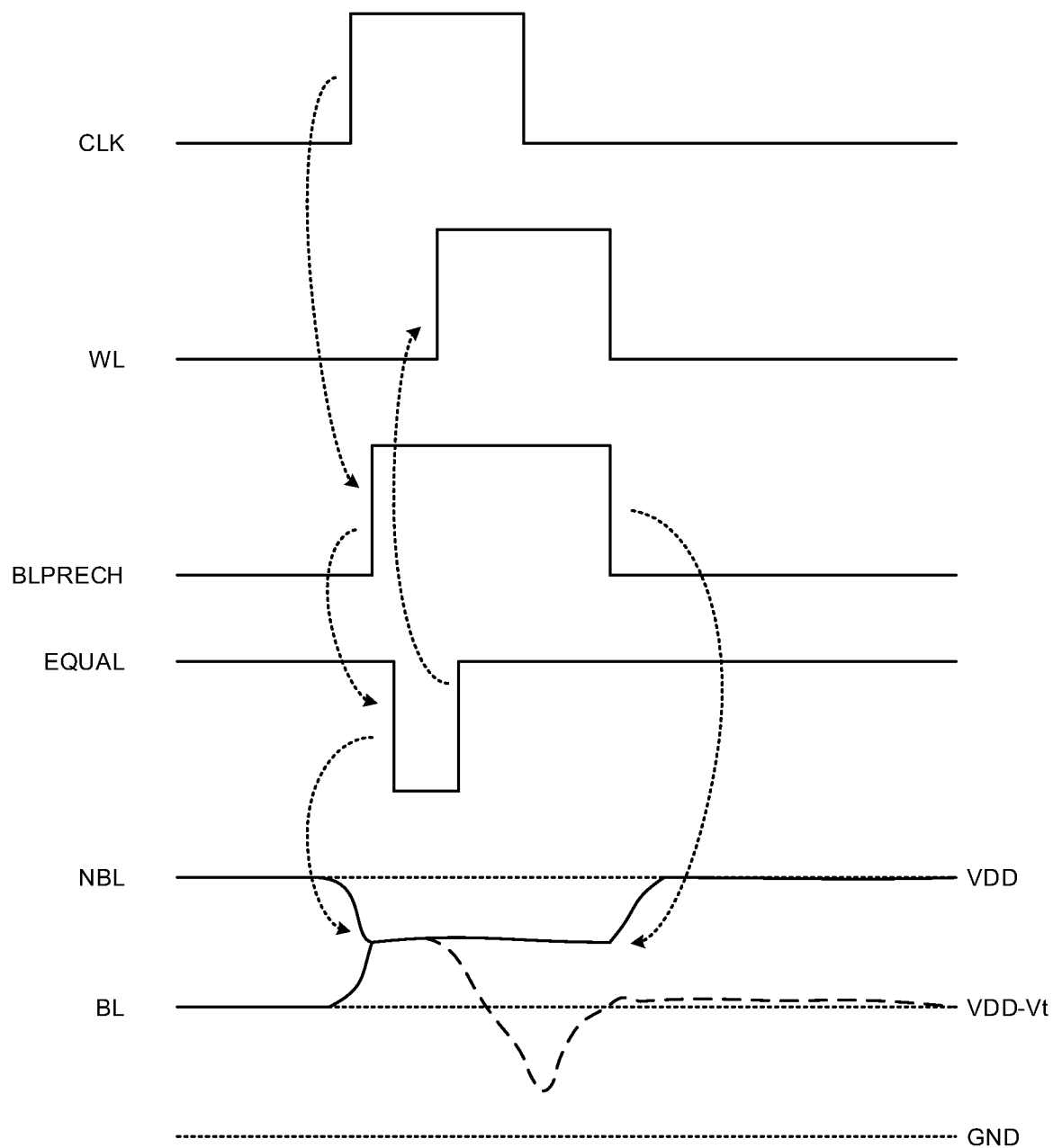
FIG. 4 illustrates a waveform diagram of operating memory architecture with equalizing circuitry in accordance with implementations described herein.

FIG. 4 illustrates a waveform diagram 400 of operating memory architecture with equalize biasing technique 404 in accordance with implementations described herein.

In some implementations, as shown in FIG. 4, the waveform diagram 400 shows that a rising edge of a clock pulse (CLK) may be used to trigger a rising edge of a bitline precharge pulse (BLPRECH), which may then trigger a falling edge of a equalizing bias pulse (EQUAL). Also, as shown, the rising ending edge of the short negative equalizing bias pulse (EQUAL) then triggers the rising edge of a wordline pulse (WL). Also, as shown, the rising edge of the clock pulse (CLK) may be used to precharge the bitlines (BL, NBL) toward the intermediate voltage level (e.g., between VDD and VDD–Vt), and then the falling edge of the equalizing bias pulse (EQUAL) may be used to keep the bitlines (BL, NBL) precharged to a voltage level above VDD–Vt, e.g., instead of falling toward ground (GND), as shown in FIG. 4 with the dashed line. Also, as shown, the falling edge of the bitline precharge pulse (BLPRECH) may be used to trigger the rising edge of the precharged bitline (NBL) voltage to the voltage level associated with VDD.

Moreover, in various implementations, in reference to FIGS. 3-4, operation of the memory architecture 304 may provide for an improved noise margin. For instance, since the internal nodes of a memory latch in 8T-SRAM bitcells have different loads due to the read-stack transistors, noise margin of the memory latch is not same from both sides of the bitlines (e.g., BL side and NBL side), unlike 6T-SRAM bitcells, which have symmetrical bitline loading on internal nodes. As such, the memory architecture 304 may be configured to utilize this unbalanced difference on the load and pre-charge the bitlines differently, e.g., by connecting the more-loaded bitline to VDD, while precharging the other bitline to VDD–Vt. At the start of a write cycle, these two bitlines may be equalized to reach the intermediate level.

Various implementations of memory architecture with wordline underdrive circuitry will be described herein with reference to FIGS. 5-6.

Figure 5:
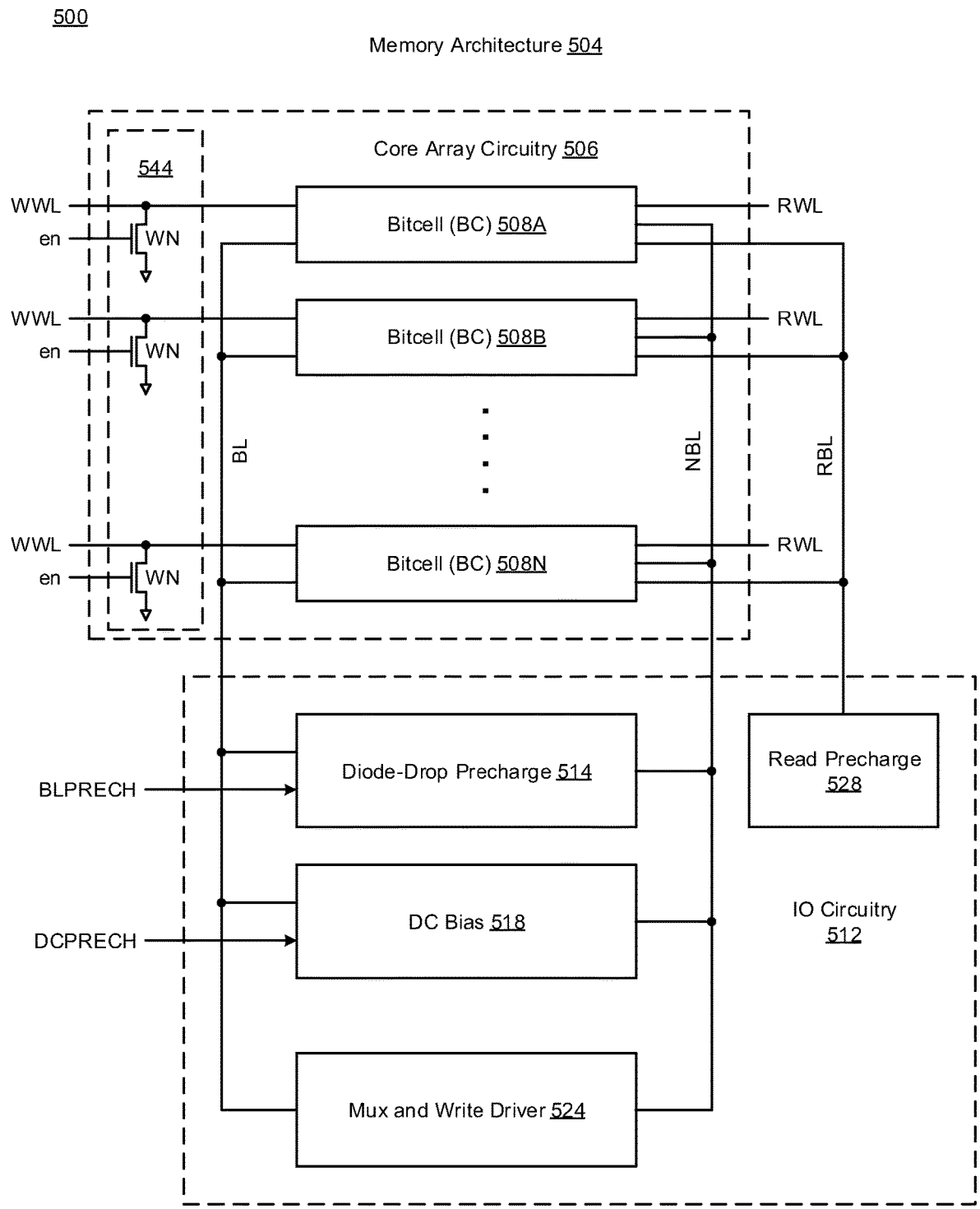
FIG. 5 illustrates a schematic diagram of memory architecture having wordline underdrive circuitry in accordance with various implementations described herein.

FIG. 5 illustrates a schematic diagram 500 of memory architecture 504 having wordline underdrive circuitry in accordance with implementations described herein.

In various implementations, the memory architecture 504 may be implemented as a system or a device having various integrated circuit (IC) components that are arranged and coupled together as an assemblage or combination of parts that provide for physical circuit designs and various related structures. In some instances, a method of designing, providing building and/or fabricating the memory architecture 504 as an integrated system or integrated device may involve use of various IC circuit components described herein so as to implement memory fabrication schemes and techniques associated therewith. Moreover, the memory architecture 504 may be integrated with various computing circuitry and related components on a single chip, and the memory architecture 504 may be implemented and incorporated in various embedded systems for automotive, electronic, mobile, server and Internet-of-things (IoT) applications, including remote sensor nodes.

As shown in FIG. 5, the memory architecture 504 may have multiple bitcells (BC: 508A, 508B, . . . , 508N) arranged in core array circuitry 506. In various implementations, the bitcells (BC: 508A, 508B, . . . , 508N) may refer to eight-transistor (8T) multi-port memory cells with a dedicated write port and a dedicated read port. As such, the memory architecture 504 may include write wordlines (WWL), write bitlines (BL, NBL), read wordlines (RWL), and read bitlines (RBL). The write wordlines (WWL) may be coupled directly to corresponding bitcells (BC: 508A, 508B, . . . , 508N), and also, the read wordlines (RWL) may be coupled directly to corresponding bitcells (BC: 508A, 508B, . . . , 508N). Moreover, the write bitlines (BL, NBL) may be routed from the bitcells (BC: 508A, 508B, . . . , 508N) to diode-drop precharge circuitry 514, DC biasing circuitry 518, and multiplexer (mux) and write driver circuitry 524. Also, the read bitlines (RBL) may be routed to read precharge circuitry 528.

As such, in some implementations, the memory architecture 504 may include the core array circuitry 506 and input-output (IO) circuitry 512. As shown in FIG. 5, the core array circuitry 506 may include the bitcells (BC: 508A, 508B, . . . , 508N), and the IO circuitry 512 may include the diode-drop precharge circuitry 514, the DC biasing circuitry 518, the mux and write driver circuitry 524, and the read precharge circuitry 528. Also, the diode-drop precharge circuitry 514 may be coupled between the bitlines (BL, NBL) and receive a bitline precharge enable signal (BL-PRECH), and the DC bias circuitry 518 may be coupled between the bitlines (BL, NBL) and receive a DC precharge enable signal (DCPRECH). Also, the mux and write driver circuitry 524 may be coupled between the bitlines (BL, NBL), and the read precharge circuitry 528 may be coupled to the bitcells (BC: 508A, 508B, . . . , 508N).

Moreover, in some implementations, the memory architecture 504 may include the memory circuitry (e.g., core array circuitry 506) having bitlines (BL, NBL, RBL) coupled to the array of bitcells (BC: 508A, 508B, . . . , 508N). The memory architecture 504 may include first precharge circuitry (e.g., DC bias circuitry 518) that is configured to precharge one or more bitlines (e.g., BL, NBL) before a write cycle. Also, the memory architecture 504 may include second precharge circuitry (e.g., diode-drop precharge circuitry 514) that is configured to precharge the one or more bitlines (e.g., BL, NBL) after the write cycle. The first precharge circuitry may refer to the direct-current (DC) bias circuitry 518 that precharges and keeps the bitlines (BL, NBL) above an initial voltage level (IV) that is lower than a supply voltage level (VDD) before the write cycle. In some instances, the initial voltage level (IV) may refer to the difference between the voltage supply level (VDD) and a threshold voltage level (Vt), such that IV=VDD–Vt. Also, during a start of the write cycle for a write operation, the DC bias circuitry 518 may apply the initial voltage level (IV) as a DC bias pulse to the bitlines (BL, NBL) for a short duration. Further, the DC bias pulse may provide a tunable bitline precharge voltage level for improving noise margin associated with the bitlines.

In some implementations, the memory circuitry (e.g., core array circuitry 506) may include wordlines (e.g., WWL, RWL) that are coupled to the array of bitcells (BC: 508A, 508B, . . . , 508N). In some instances, the rising edge of the wordline signal on at least one wordline (WWL) of the wordlines may be delayed and start after the DC bias pulse ends. Moreover, the memory circuitry (e.g., core array circuitry 506) may include wordline underdrive (WLUD) circuitry 544 that may be used to discharge the wordlines (WWL), e.g., during precharging of the bitlines (BL, NBL). As shown in FIG. 5, the WLD circuitry 544 may include one or more transistors (e.g., WN) that are coupled to the wordlines (WWL), wherein each transistor (WN) may be coupled between a corresponding worldline (WWL) and ground (GND). Also, each transistor (WN) may be selectively activated with a WLUD enable signal (en).

Also, in some implementations, the second precharge circuitry may refer to the diode-drop precharge circuitry 514 that is configured to precharge and keep the bitlines (BL, NBL) at a diode-drop voltage level (DDV) that is lower than a supply voltage level (VDD) after the write cycle. In some instances, the diode-drop voltage level (DDV) may be within a range of 15-20% lower than the voltage supply level (VDD).

Further, in some implementations, in reference to a diode-drop only configuration, the DC bias circuitry 518 may include multiple DC bias circuits, such as, e.g., a first DC bias circuit and a second DC bias circuit, that are coupled together and configured to selectively precharge the bitlines (BL, NBL) in one or more operational modes based on an operating voltage. For instance, the memory architecture 504 may have third precharge circuitry (e.g., another DC bias circuit) that may be configured to precharge the bitlines (BL, NBL) in a first operation mode based on an operating voltage. In this instance, the first precharge circuitry (e.g., first DC bias circuitry) may be configured to precharge the bitlines (BL, NBL) in a second operational mode based on the operating voltage that is different than the first operational mode. Also, in this instance, the second precharge circuitry (diode-drop precharge circuitry 514) may be configured to precharge the bitlines (BL, NBL) in a third operational mode based on the operating voltage that is different than the first operational mode and/or the second operational mode. The first operational mode may refer to low voltage operation, wherein the bitlines (BL, NBL) are kept at a voltage level above the diode-drop voltage level (DDV) using the third precharge circuitry (e.g., second DC bias circuitry). The second operational mode may refer to nominal voltage operation, wherein the bitlines (BL, NBL) are kept at a voltage level above the diode-drop voltage level (DDV) using first precharge circuitry. Also, the third operational mode may refer to high voltage operation using the second precharge circuitry (e.g., second DC bias circuitry).

In some implementations, the memory architecture 504 may refer to static random access memory (SRAM) architecture with multiple access ports controlled by wordlines (WL, RWL) and bitlines (BL, NBL, RBL). Also, the bitcells (BC: 508A, 508B, . . . , 508N) may refer to SRAM bitcells that are implemented with 8T multi-port bitcells. Also, in some instances, the bitcells (BC: 508A, 508B, . . . , 508N) may include multiple transistors (e.g., 8T) that refer to field effect transistor (PFET) devices, such as, e.g., P-type FET (PFET) devices and/or N-type FET (NFET) devices. Moreover, the multiple access port devices may be varied within the 8T multiple-port bitcell so that some access devices (e.g., by port) are NFET devices and some access devices by port are PFET devices.

Figure 6:
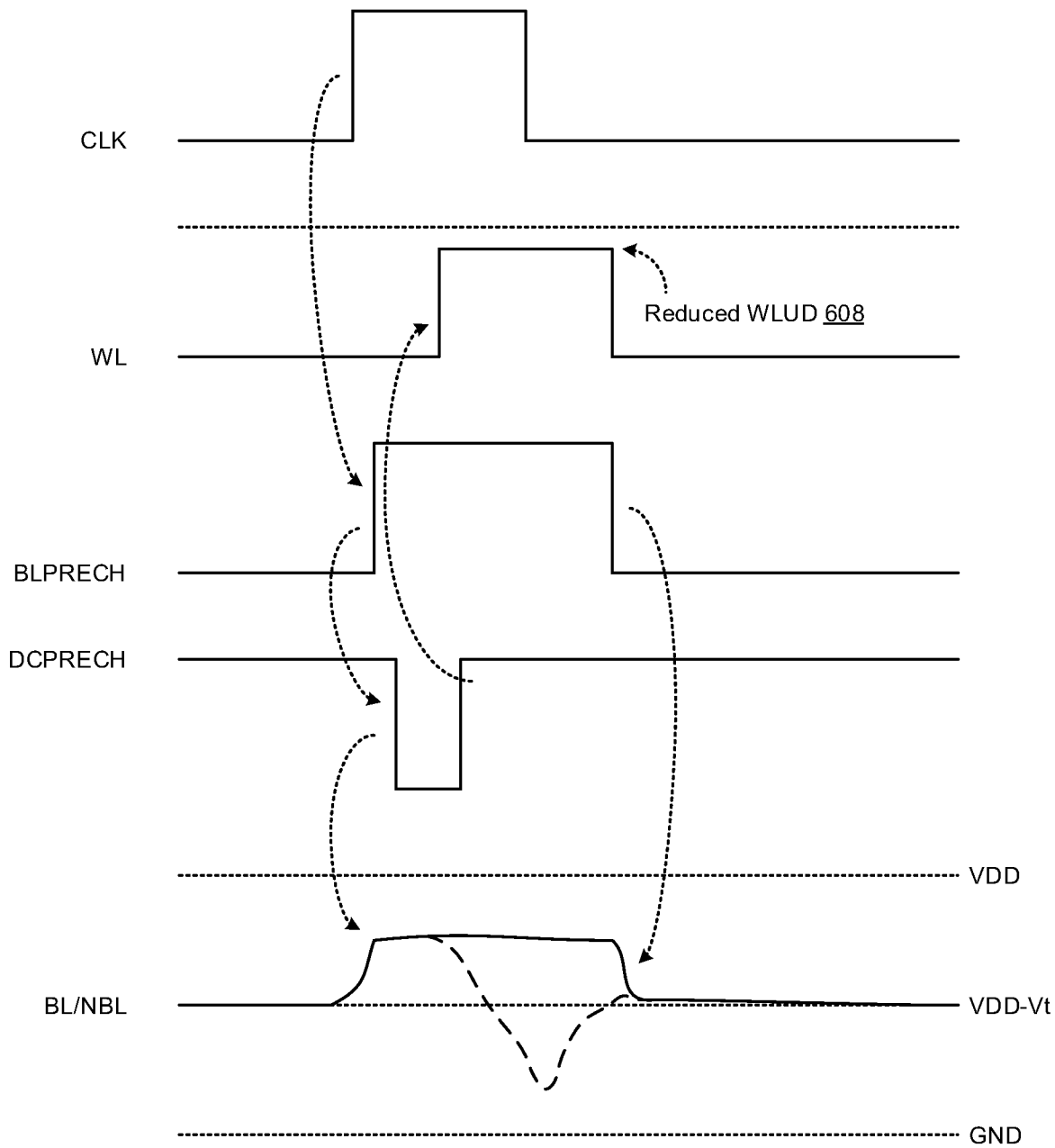
FIG. 6 illustrates a waveform diagram of operating memory architecture with wordline underdrive circuitry in accordance with implementations described herein.

FIG. 6 illustrates a waveform diagram 600 of operating memory architecture with wordline underdriving technique 604 in accordance with implementations described herein.

In some implementations, as shown in FIG. 6, the waveform diagram 600 shows that a rising edge of a clock pulse (CLK) may be used to trigger a rising edge of a bitline precharge pulse (BLPRECH), which may then trigger a falling edge of a DC precharge pulse (DCPRECH). Also, as shown, the rising ending edge of the short negative DC precharge pulse (DCPRECH) then triggers the rising edge of a wordline pulse (WL), and in this instance, due to the use of the WLUD circuitry 544 in FIG. 5, the wordline pulse (WL) has a reduced WLUD voltage 608. Further, as shown, the rising edge of the clock pulse (CLK) may be used to precharge the bitlines (BL, NBL) toward VDD, and the falling edge of the DC precharge pulse (DCPRECH) may be used to keep the bitlines (BL, NBL) precharged to a voltage level above VDD−Vt, e.g., instead of falling toward ground (GND), as shown in FIG. 2 with the dashed line. Also, as shown, the falling edge of the bitline precharge pulse (BLPRECH) may be used to trigger the falling edge of the precharged bitline voltage to the voltage level associated with VDD−Vt.

Moreover, in various implementations, in reference to FIGS. 3-4, operation of the memory architecture 304 may provide for combining wordline underdrive (WLUD) with diode-drop and/or DC bias. In some instances, the memory architecture 304 may be configured to provide for a lowered BL voltage level that may substantially reduce need for WLUD. In other instances, the memory architecture 304 may provide for combining WLUD with diode-drop and/or DC bias for some bitcells that may need substantial WLUD.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a device having memory circuitry with bitlines coupled to an array of bitcells. The device may have first precharge circuitry that precharges the bitlines before a write cycle. The device may have second precharge circuitry that precharges the bitlines after the write cycle.

Described herein are implementations of a device having memory circuitry with bitlines coupled to an array of bitcells. The device may have first precharge circuitry that precharges a first bitline of the bitlines to a diode-drop voltage level (DDV) before a write cycle. The device may have second precharge circuitry that precharges a second bitline of the bitlines to a supply voltage level (VDD) before the write cycle.

Described herein are implementations of a device having memory circuitry with wordlines and bitlines coupled to an array of bitcells. The device may have direct-current (DC) bias circuitry that precharges the bitlines before a write cycle. The device may have underdrive circuitry that discharges the wordlines during precharging of the bitlines.

Reference has been made in detail to various implementations, examples of which are shown in the accompanying drawings and figures. In the following detailed description, numerous specific details are set forth to provide a thorough understanding of the disclosure provided herein. However, the disclosure provided herein may be practiced without these specific details. In other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. In some instances, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting

[the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
memory circuitry having bitlines coupled to an array of bitcells;
first precharge circuitry that precharges the bitlines before a write cycle; and
second precharge circuitry that precharges the bitlines after the write cycle,
wherein the first precharge circuitry refers to direct-current (DC) bias circuitry, and
wherein during a start of the write cycle for a write operation, the DC bias circuitry applies an initial voltage level (IV) as a DC bias pulse to the bitlines for a duration shorter than the precharging by the second precharge circuitry, and
wherein the DC bias pulse is triggered after a rising edge of a pulse generated by the second precharge circuitry and a rising edge of a wordline signal on at least one wordline of the wordlines starts after the DC bias pulse ends.

2. The device of claim 1, wherein the direct-current (DC) bias circuitry precharges and keeps the bitlines above the initial voltage level (IV) that is lower than a supply voltage level (VDD) before the write cycle, and wherein the DC bias pulse is a negative DC precharge pulse.

3. The device of claim 2, wherein the initial voltage level (IV) refers to difference between the voltage supply level (VDD) and a threshold voltage level (Vt) such that IV=VDD−Vt.

4. The device of claim 1, wherein:
the DC bias pulse provides a tunable bitline precharge voltage level for improving noise margin associated with the bitlines.

5. The device of claim 1, wherein:
memory circuitry has wordlines coupled to the array of bitcells,
wherein a rising edge of a wordline signal on at least one wordline of the wordlines is delayed and starts after the DC bias pulse ends.

6. The device of claim 1, wherein the second precharge circuitry refers to diode-drop precharge circuitry that precharges and keeps the bitlines at a diode-drop voltage level (DDV) that is lower than a supply voltage level (VDD) after the write cycle.

7. The device of claim 6, wherein the diode-drop voltage level (DDV) is within a range of 15-20% lower than the voltage supply level (VDD).

8. A device comprising:
memory circuitry having bitlines coupled to an array of bitcells;
first precharge circuitry that precharges the bitlines before a write cycle;
second precharge circuitry that precharges the bitlines after the write cycle; and
third precharge circuitry that precharges the bitlines in a first operation mode based on an operating voltage,
wherein the first precharge circuitry precharges the bitlines in a second operational mode based on the operating voltage that is different than the first operational mode, and
wherein the second precharge circuitry precharges the bitlines in a third operational mode based on the operating voltage that is different than the first operational mode and the second operational mode.

9. The device of claim 8, wherein:
the first operational mode refers to low voltage operation, wherein the bitlines are kept at a voltage level above a diode-drop voltage level (DDV) using the third precharge circuitry,
the second operational mode refers to nominal voltage operation, wherein the bitlines are kept at the voltage level above the diode-drop voltage level (DDV) using first precharge circuitry, and
the third operational mode refers to high voltage operation using the second precharge circuitry.

10. The device of claim 8, wherein the first precharge circuitry refers to direct-current (DC) bias circuitry.

11. The device of claim 10, wherein the DC bias circuitry keeps the bitlines above an initial voltage level (IV) that is lower than a supply voltage level (VDD) before the write cycle.

12. The device of claim 11, wherein the initial voltage level (IV) refers to difference between the voltage supply level (VDD) and a threshold voltage level (Vt) such that IV=VDD−Vt.

13. The device of claim 8, wherein:
the first precharge circuitry refers to diode-drop precharge circuitry that precharges a first bitline to a diode-drop voltage level (DDV) before the write cycle, and
the diode-drop voltage level (DDV) is lower than a supply voltage level (VDD) such that VDD>DDV.

14. The device of claim 13, wherein:
the diode-drop voltage level (DDV) is greater than a difference between the voltage supply level (VDD) and a threshold voltage level (Vt) such that VDD>DDV>VDD−Vt.

15. A device comprising:
memory circuitry having bitlines coupled to an array of bitcells;
first precharge circuitry that precharges the bitlines before a write cycle; and
second precharge circuitry that precharges the bitlines after the write cycle,
wherein the first precharge circuitry is triggered after a rising edge of a pulse that is generated by the second precharge circuitry and a rising edge of a wordline signal on at least one wordline of the wordlines starts after the first precharge circuitry stops precharging.

16. The device of claim 15, wherein the first precharge circuitry refers to direct-current (DC) bias circuitry and the second precharge circuitry refers to diode-drop precharge circuitry.

17. The device of claim 16, wherein the diode-drop precharge circuitry precharges and keeps the bitlines at a diode-drop voltage level (DDV) that is lower than a supply voltage level (VDD) after the write cycle by 15%-20%.

18. The device of claim 16, further comprising:
third precharge circuitry that precharges the bitlines in a first operation mode based on an operating voltage, wherein the first operational mode refers to low voltage operation.

19. The device of claim 16, wherein the DC bias circuitry applies an initial voltage level (IV) as a DC bias pulse to the bitlines for a duration shorter than the precharging by the diode-drop precharge circuitry.

* * * * *